United States Patent [19]

Tozawa

[11] Patent Number: 5,493,263
[45] Date of Patent: Feb. 20, 1996

[54] MICROSTRIP WHICH IS ABLE TO SUPPLY DC BIAS CURRENT

[75] Inventor: Norio Tozawa, Kawasaki, Japan

[73] Assignee: Fujitsu Limited, Kawasaki, Japan

[21] Appl. No.: 27,153

[22] PCT Filed: Jul. 17, 1992

[86] PCT No.: PCT/JP92/00913

§ 371 Date: Mar. 18, 1993

§ 102(e) Date: Mar. 18, 1993

[87] PCT Pub. No.: WO93/02485

PCT Pub. Date: Apr. 2, 1993

[30] Foreign Application Priority Data

Jul. 19, 1991 [JP] Japan ................................. 3-179410

[51] Int. Cl.6 ......................................................... H01P 3/08
[52] U.S. Cl. ............................................. 333/238; 333/246
[58] Field of Search ........................................ 333/238, 246, 333/295

[56] References Cited

U.S. PATENT DOCUMENTS 3,585,533  6/1971  Denhard ........................... 333/238 X
4,460,880  7/1984  Turner .................................. 333/238

FOREIGN PATENT DOCUMENTS 58-36841   8/1983  Japan .
52901      3/1984  Japan ................................... 333/238
60-33705   2/1985  Japan .
61-22330   7/1986  Japan .
1-158801   6/1989  Japan .
314403    12/1989  Japan ................................... 333/246
203401     9/1991  Japan ................................... 333/246

*Primary Examiner*—Benny T. Lee
*Attorney, Agent, or Firm*—Armstrong, Westerman, Hattori, McLeland & Naughton

[57] ABSTRACT

Provided is a microstrip line that permits a large current flow while maintaining a high characteristic impedance. The microstrip line, comprising a dielectric substrate (10), a grounded conductor (12), and a conducting strip (14), includes an upper conductor (16) formed substantially along the centerline of the conducting strip (14) and having a vertically elongated cross section such that a width w1 of a base (16a) of the cross section is smaller than the width W of the conducting strip (14), while a width w2 of a portion extending from the base (16a) to its opposing side (16b) is substantially equal to the width w1 of the base (16a) or gradually increases toward an upper portion. The upper conductor (16) having such cross section is formed by heat bonding a gold, silver, or copper wire, etched into a desired cross section, onto the conducting strip (14), or by depositing gold, silver, or copper by plating onto the conducting strip.

3 Claims, 9 Drawing Sheets

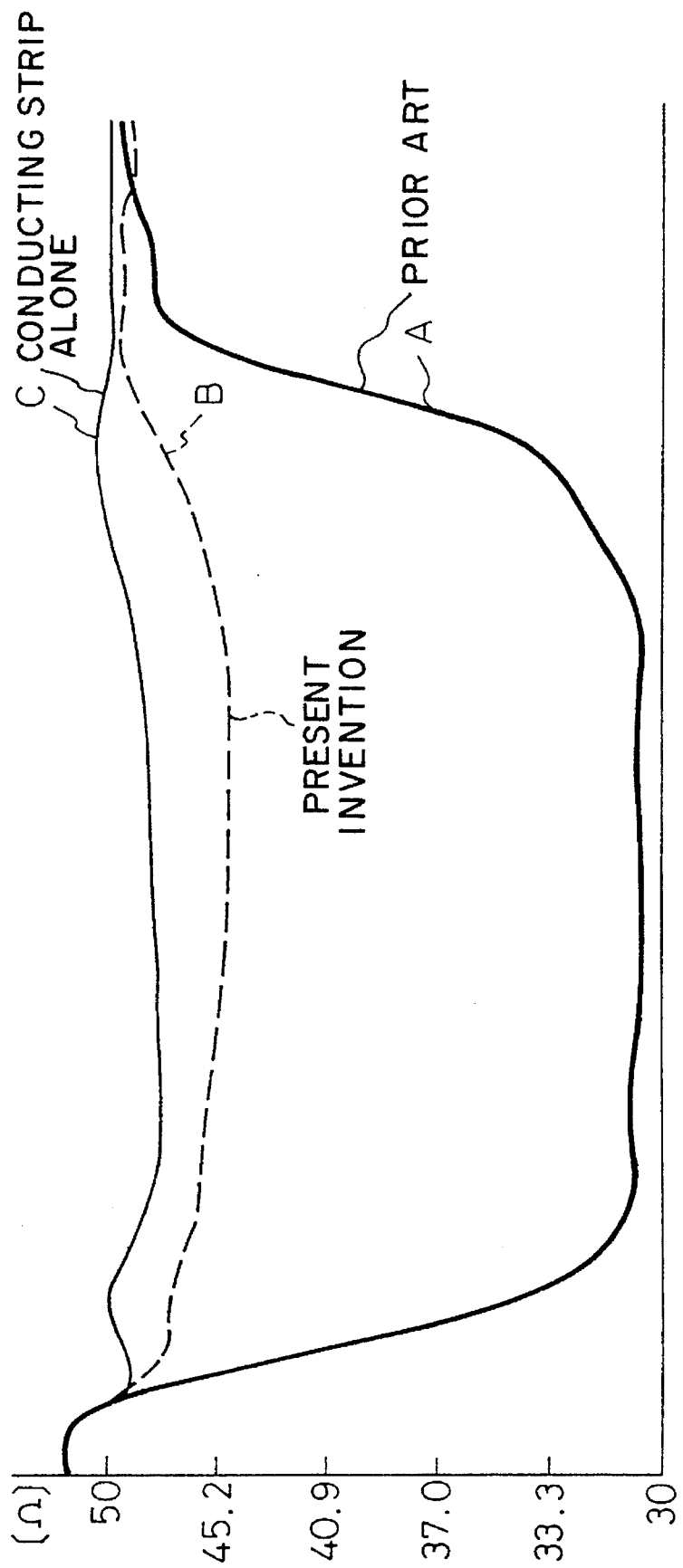

MICROSTRIP WHICH IS ABLE TO SUPPLY DC BIAS CURRENT

TECHNICAL FIELD

The present invention relates to a microstrip line, and more particularly to a microstrip line with a high characteristic impedance suitable for use as a bias supply circuit in microwave circuit applications, and also relates to a method of fabricating such a microstrip line.

BACKGROUND ART

In recent years, the power output of field-effect transistors (FETs) and bipolar transistors for microwave frequency applications has been increased, so that nowadays microwave power of 20 W and over can be obtained with a single transistor. However, since the working voltage of such a transistor is as low as about 10 V, a large DC bias current of 5 to 8A is needed.

On the other hand, for bias supply circuits, there has been a demand for DC current to be supplied via a microstrip line of high characteristic impedance in order to minimize the effect in the frequency range in which the microwave circuit is used. Maintaining such a high characteristic impedance, however, requires reducing the width of the conductor strip.

Accordingly, there is a demand to provide a microstrip line that permits a large DC current supply while maintaining a high characteristic impedance.

To meet such a demand, it has been practiced in the prior art to bond a fine gold wire or gold ribbon to a conductor strip of high characteristic impedance to achieve a reduction in DC resistance.

However, such a technique has only been effective in permitting a current of a magnitude two to three times greater than when the conductor strip is used alone, and has not been able to supply sufficient DC bias current for a high power transistor that requires a large current.

Furthermore, in a monolithic microwave circuit that is formed simultaneously with a large number of active and passive elements on a semiconductor substrate, the above technique of bonding a gold wire or gold ribbon to a conductor strip cannot be employed because of dimensional constraints.

In Japanese Unexamined Patent Publication No. 1-158801, there is disclosed a microstrip line comprising a conductor strip having a T-shaped cross section with the top width at least two times greater than the bottom width. The upper overhang provides a conductor cross section that allows a large DC current, and yet, its contribution to the characteristic impedance is small because of the presence of an air layer between the overhang and the dielectric substrate. Thus, with the T-shaped cross section, the resulting microstrip line has a high characteristic impedance and, at the same time, is capable of handling a sufficiently large DC current flow.

However, although the contribution of the overhang to the characteristic impedance is small, the contribution may increase to a degree that cannot be neglected if the area of the overhang is large and if the distance to the dielectric substrate is small. According to the method disclosed in the above patent publication for the fabrication of a microstrip line having a T-shaped cross section, which method combines a layer formation process with a photoetching process, the distance between the overhang and the dielectric substrate is inevitably reduced, and also, the area of the overhang increases as the top width is enlarged to permit a larger current flow. Thus, the prior art method has a problem that there is a limit to the allowable current value because the characteristic impedance decreases if the T-shaped cross section is so formed as to allow a larger current flow.

SUMMARY OF THE INVENTION

It is an object of the invention to provide a microstrip line and a method of fabricating the same, which permits a large current supply while maintaining a high characteristic impedance.

According to the invention, there is provided a microstrip line which comprises: a dielectric substrate having a lower surface and an upper surface opposite to the lower surface; a grounded conductor formed on the lower surface of the dielectric substrate; a conducting strip of width W formed on the upper surface of the dielectric substrate; and an upper conductor formed on top of the conducting strip and having a cross section whose maximum width w2 is smaller than the width W of the conducting strip.

According to the invention, there is also provided a method of fabricating a microstrip line, comprising the steps of: preparing a microstrip line proper including a conducting strip of width W formed on an upper surface of a dielectric substrate that has a lower surface opposite to the upper surface and is capable of having a grounded conductor formed thereon; forming an upper conductor having a cross section whose maximum width w2 is smaller than the width W of the conductor strip; and bonding the upper conductor onto the conductor strip of the microstrip line proper.

According to the invention, there is further provided a method of fabricating a microstrip line, comprising the steps of: preparing a microstrip line proper including a conducting strip of width W formed on an upper surface of a dielectric substrate that has a lower surface opposite to the upper surface and capable of having a grounded conductor formed thereon; forming a mold for forming an upper conductor by plating on top of the conducting strip on the upper surface of the microstrip line proper, the upper conductor having a cross section whose maximum width w2 is smaller than the width W of the conducting strip; and forming the upper conductor by plating.

BRIEF DESCRIPTION OF THE DRAWINGS

In the drawings, like numerals refer to like structure.

FIG. 7 is a graph showing the results of the comparison tests of characteristic impedances;

BEST MODE FOR CARRYING OUT THE INVENTION

Throughout the following description, similar elements and similar dimensions of similar elements illustrated in the figures are referred to with the same alphanumeric labels. Similar elements may not be described in detail in each figure.

Figure 1:
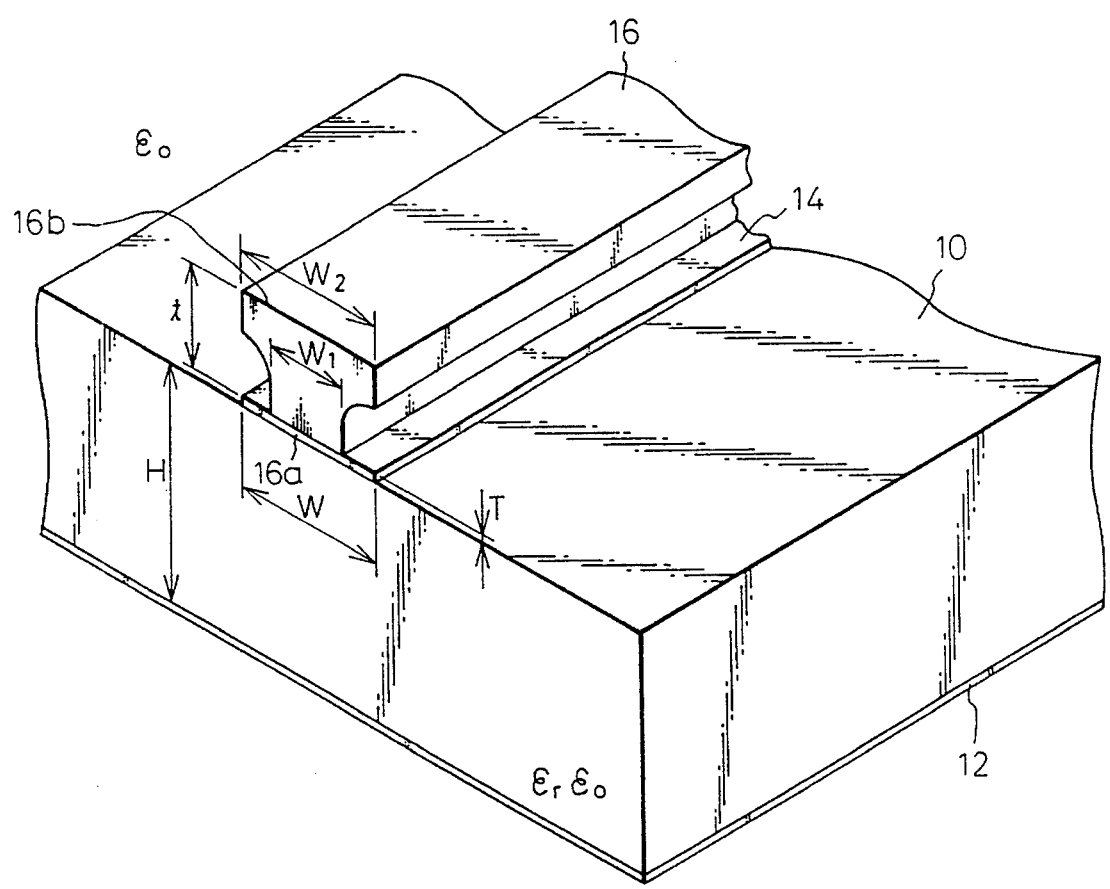
FIG. 1 is a perspective view illustrating a first embodiment of the invention.

FIG. 1 is a perspective view of a microstrip line according to one embodiment of the invention. As shown in FIG. 1, the microstrip line comprises a dielectric substrate 10 of thickness H and having a permativity $\epsilon_r \epsilon_0$, a grounded conductor 12 formed on the back surface of the dielectric substrate 10, a conducting strip 14 of width W and thickness T formed on the top surface of the dielectric substrate 10, and an upper conductor 16 formed on top of the conducting strip 14.

The upper conductor 16 has a cross-sectional thickness t, the lower portion of which has a width w1 that is smaller than the width W of the conducting strip, and the upper portion of which has a width w2 that is smaller than W but larger than w1, the width of the in-between portion gradually increasing from w1 to w2.

Figure 2:
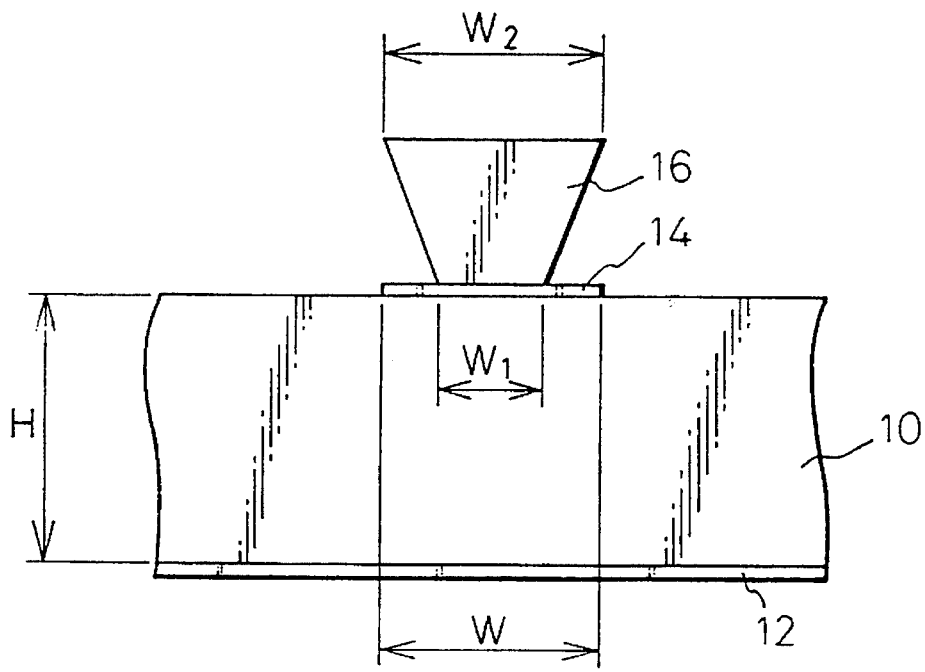
FIGS. 2 and 3 are cross-sectional views illustrating other embodiments of the invention.
Figure 3:
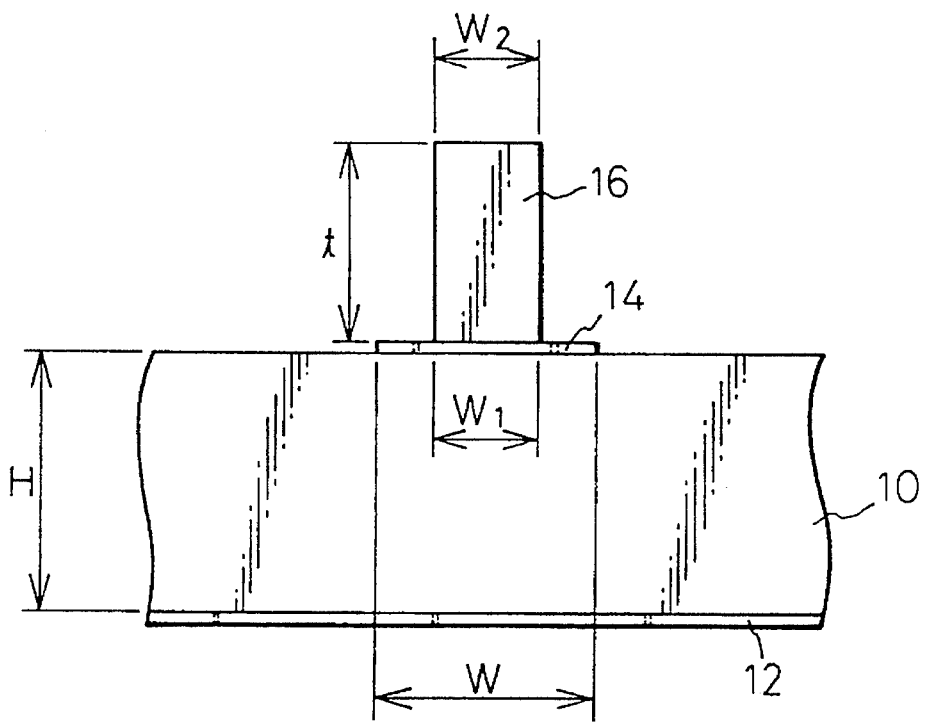

FIGS. 2 and 3 are cross-sectional views showing microstrip lines according to other embodiments of the invention. In the microstrip line shown in FIG. 2, the upper conductor 16 has a wedgelike cross section with an upper end width of w2 and a lower end width of w1. In the microstrip line shown in FIG. 3, the upper conductor 16 has a rectangular cross section having a width w1 equal to w2. In either example, the maximum width w2 of the upper conductor 16 is smaller than the width W of the conducting strip. Other than those shown, various cross-sectional shapes are possible that can satisfy the above condition.

We will now describe the effect on the characteristic impedance produced by the upper conductor 16 formed on the conducting strip to increase the DC current capacity in accordance with the invention.

The characteristic impedance Zo of a microstrip line is given by $$Z_o = \frac{1}{c \cdot C_o \sqrt{\epsilon_{eff}}} \quad (1)$$

where c is the velocity of light, $\epsilon_{eff}$ is the effective dielectric constant, and Co is the distributed capacitance. From Equation (1), it can be seen that the variation of the characteristic impedance Zo can be estimated from the variation of the distributed capacitance Co.

Suppose that the microstrip line, shown in FIGS. 1 to 3, is loaded with electrostatic charges. Since the maximum width w2 of the upper conductor 16 is smaller than the width W of the conducting strip 14, it is apparent that most of the charges on the side of the conducting strip 14 having the upper conductor 16 thereon are distributed within the lower surface width W of the conducting strip 14. Therefore, the provision of the upper conductor 16 contributes to only a slight increase in the distributed capacitance Co, which means a small decrease in the characteristic impedance Zo.

Figure 4:
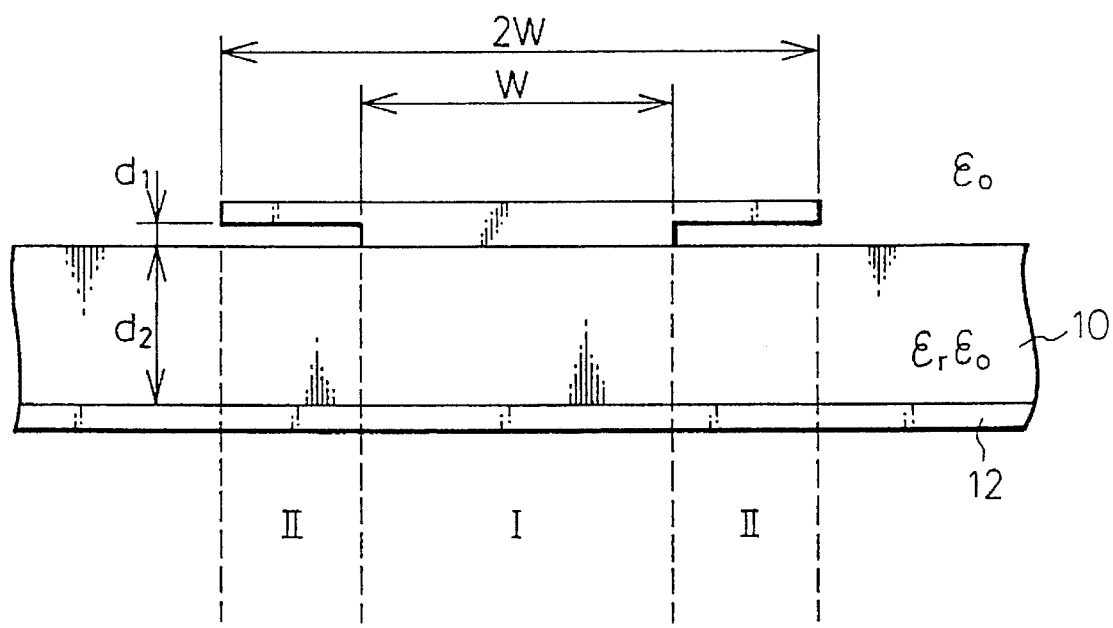
FIG. 4 is a cross-sectional view of a microstrip line according to a prior art example.

On the other hand, the microstrip line disclosed in Japanese Unexamined Patent Publication No. 1-158801 has a T-shaped cross section as shown in FIG. 4. The distributed capacitances C (capacitance per unit length) of the regions I an II (overhanging portions) of FIG. 4 are given by $$C_I = \frac{\epsilon_r}{d_2} \epsilon_o W$$

$$C_{II} = \frac{\epsilon_r}{\epsilon_r d_1 + d_2} \epsilon_o W$$

where $\epsilon_o$ denotes permittivity of vacuum or air, $\epsilon_r$ denotes relative permittivity of dielectric substrate 10, and W, $d_1$, and $d_2$ denote the distances shown in FIG. 4.

The above relations neglect the edge effect. It is also assumed that the top width of the T-shaped conducting strip is 2 W which is two times the bottom width W. Therefore, the ratio $\rho$ of the combined distributed capacitance $C_I+C_{II}$ of the regions I+II to the distributed capacitance $C_I$ of the region I alone, is given as $$\rho = \frac{C_I + C_{II}}{C_I} = \frac{2 + \epsilon_r(d_1/d_2)}{1 + \epsilon_r(d_1/d_2)} \quad (2)$$

Substituting $\epsilon_r=2.5$, $d_1=0.035$ mm, and $d_2=0.8$ mm, typical values in a microwave band high power output amplifier, into Equation (2), we have $$\rho=1.9$$

Therefore, in this case, it is expected that a typical characteristic impedance of 50 Ω will drop to 50/1.9= 26.3 Ω because of the effect of the overhang.

When $\epsilon_r=13$, $d_1=3$ μm, and $d_2=100$ μm, typical values in a GaAs MMIC are substituted, we have $$\rho=1.72$$

Hence, it is expected that the characteristic impedance of 50 Ω will drop to 50/1.72=29 Ω.

Figure 5:
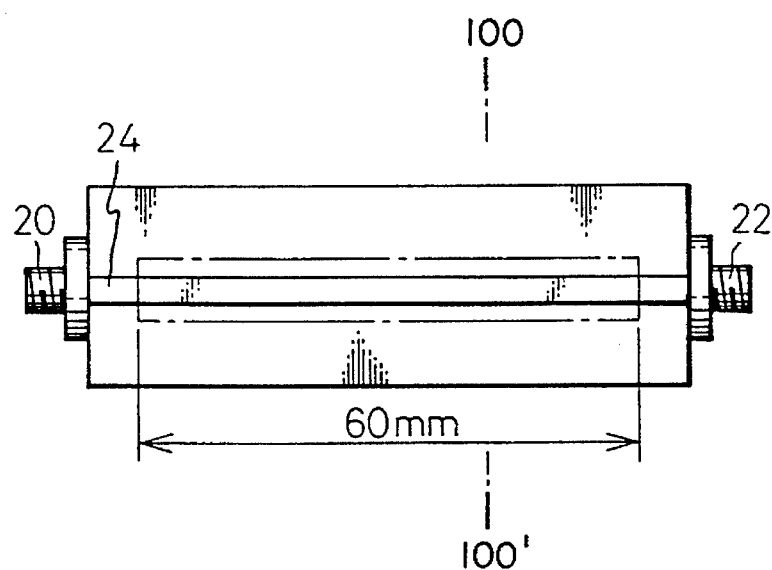
FIG. 5 is a plan view showing an apparatus used for comparison tests of characteristic impedances.
Figure 6A:
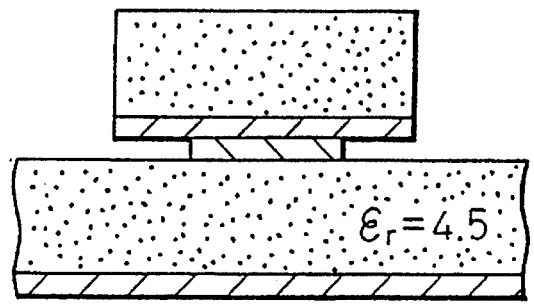
FIGS. 6A, 6B, and 6C are cross-sectional views of samples used for the comparison tests of characteristic impedances.
Figure 6B:
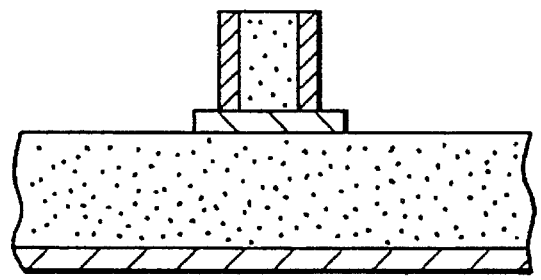
Figure 6C:
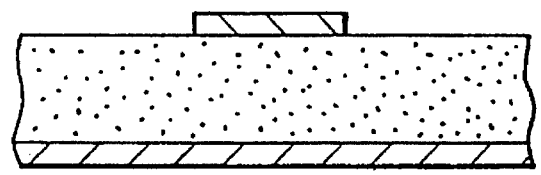

Samples having the cross-sectional shapes and dimensions shown in FIGS. 6A to 6C were prepared, the cross sections being taken along line A—A' in FIG. 5, and using an apparatus such as shown in the plan view of FIG. 5, their reflection coefficients were measured, from which their characteristic impedances were calculated. The results are shown in FIG. 7. In FIG. 5, the reference numerals 20 and 22 designate connectors, and the numeral 24 indicates the microstrip line under measurement between them. The portion of the microstrip line 24, enclosed with a rectangle indicated by a dashed line (the length being illustrated as 60 mm), was formed in such a way as to provide the various cross-sectional shapes shown in FIGS. 6A to 6C, and their reflection coefficients were measured to obtain their characteristic impedances. FIG. 6A shows the prior art structure disclosed in the aforementioned Japanese Unexamined Patent Publication (where the permittivity of the dielectric substrate $\epsilon_r$ is 4.5), FIG. 6B relates to the structure of the invention, and FIG. 6C illustrates a structure in which only a conducting strip is formed. As can be seen in FIG. 6a, the distance between the overhang and the substrate, is 0.035 mm, and the thickness of the substrate is 0.8 mm, and in addition, the width of the upper wider portion in FIG. 6a, is 30 mm, whereas the width of the more narrow bottom portion, is 15 mm. As can be seen in FIG. 6b, a conducting strip is formed 15 mm wide, whereas the upper portion on the conducting strip, has a dimension of 10 mm by 10 mm. As can be seen in FIG. 6c, the conducting strip has a width of 15 mm. In FIG. 7, the abscissa corresponds to the lateral direction of the microstrip line 24. It can be seen from FIG. 7 that the prior art microstrip line (curve A) exhibits a sharp drop in characteristic impedance as compared with the curve C whereas the microstrip line of the invention (curve B) shows only a small decrease in the characteristic impedance.

In the embodiment of the invention shown in FIG. 1, the dielectric substrate 10 is formed preferably from TEFLON glass with thickness H of 0.8 mm, and the conducting strip 14 is preferably made of copper with width W of 0.5 mm and thickness T of 35 μm. The cross-sectional thickness t of the upper conductor 16 is 0.4 mm.

To form the upper conductor 16 having a base 16a and an opposing side 16b, a plate-like member of gold, silver, or copper, having a thickness of about 0.4 mm, is formed by etching it into a wire-like member having a cross section as shown, which is then bonded by soldering, etc., along the centerline of the conducting strip 14 to complete the formation of the upper conductor 16. In an example in which the thus formed microstrip line was applied to a bias supply circuit in a microwave circuit, it was possible to flow eight times greater current, with little decrease in characteristic impedance, as compared with the structure not provided with the upper conductor 16.

Figure 8A:
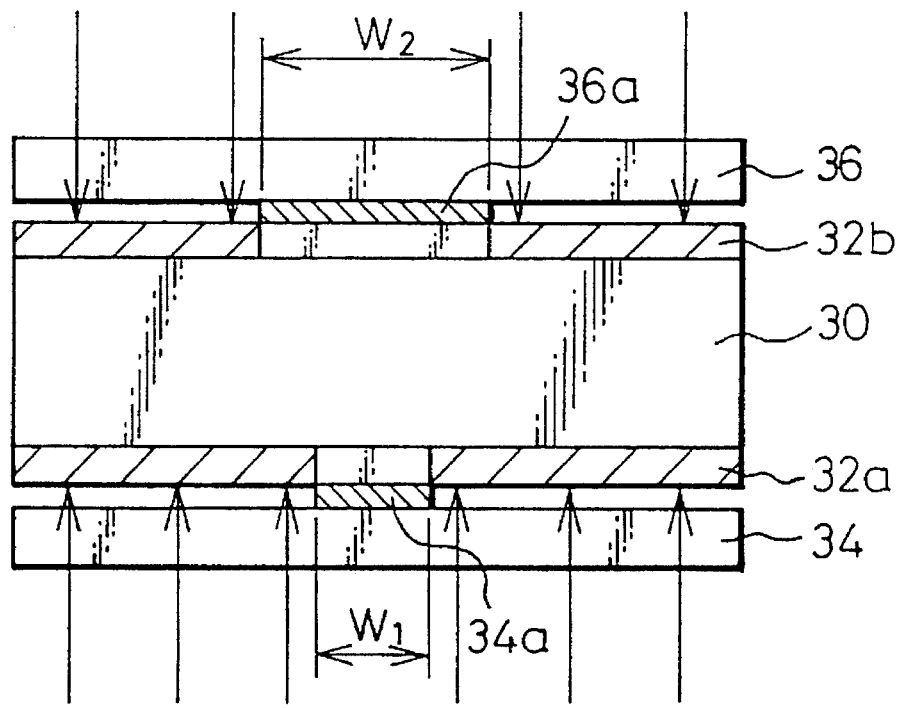
FIGS. 8A and 8B are cross-sectional views illustrating a fabrication process according to a first method of microstrip line fabrication of the invention.
Figure 8B:
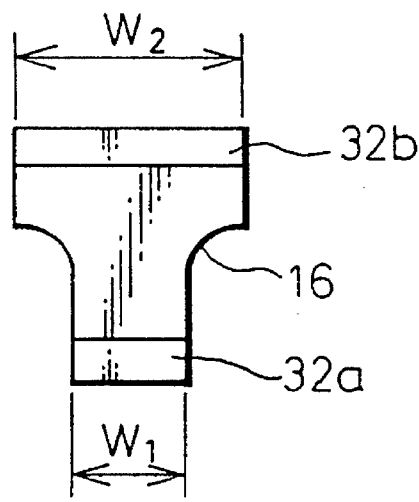

FIGS. 8A and 8B are diagrams for explaining a fabrication method for the upper conductor, each diagram showing part of a photoetching step.

As shown in FIG. 8A, positive photoresists 32a and 32b are applied to both sides of a plate-like member 30 of gold, silver, or copper, which is then sandwiched between glass 34 having a mask 34a of line width w1 and glass 36 having a mask 36a of line width w2. The sandwiched structure is then exposed to ultraviolet radiation from both sides, thereby transferring the patterns from the masks 34a, 36a to the photoresists 32a, 32b. Next, using a developer solution special for the resists, the portions (indicated by oblique hatching) of the resists that have been exposed to ultraviolet radiation are removed, and further, the portions of the metal not protected by the resists are chemically etched away.

In the chemical etching treatment, if an appropriate time difference is provided between the treatment of the upper surface and the treatment of the lower surface of the metal, the upper conductor 16 having a substantially T-shaped cross section can be obtained as shown in FIG. 8B. The remaining resists 32a and 32b are then removed using a special stripping solvent.

The patterns of the masks 34a and 36b can be written in either straight line or polygonal line form to match the circuit pattern of the microwave circuit, and therefore, the upper conductor 16 can be formed in a pattern that matches the pattern of the circuit to which it is soldered.

Figure 9A:
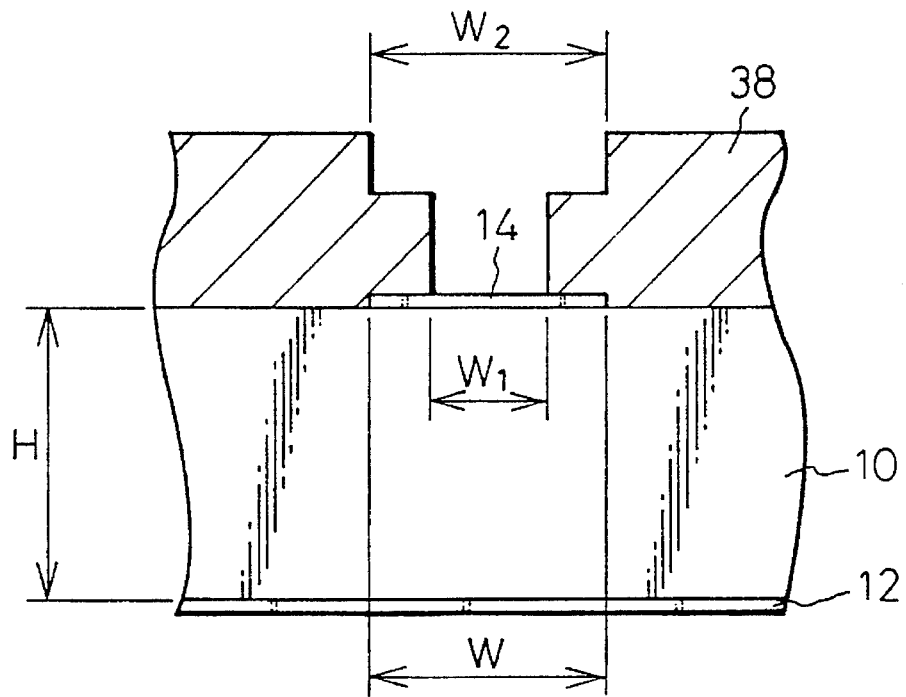
FIGS. 9A and 9B are cross-sectional views illustrating a fabrication process according to a second method of microstrip line fabrication of the invention.
Figure 9B:
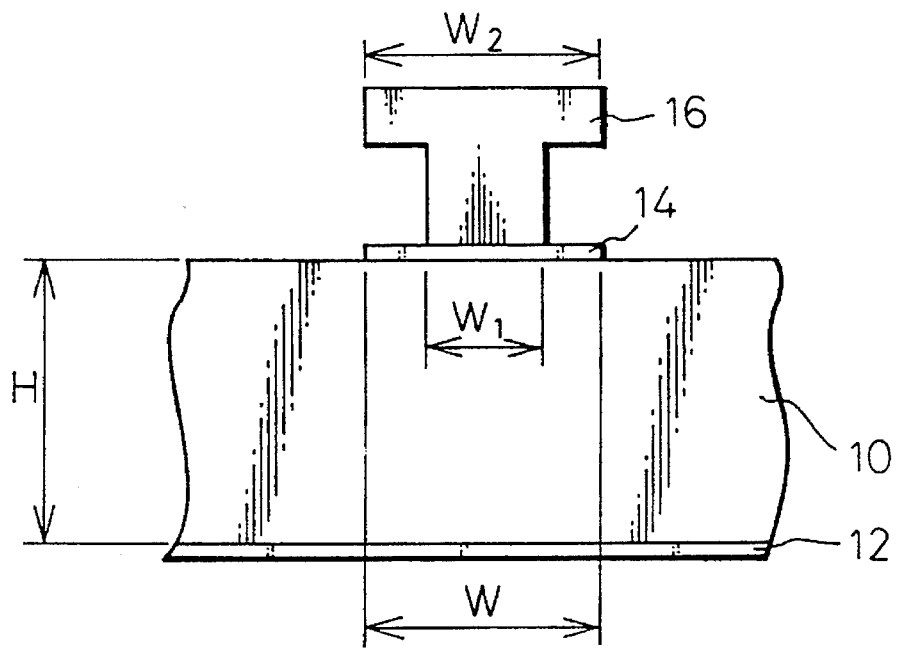

FIGS. 9A and 9B are diagrams for explaining another fabrication process for the upper conductor, each diagram showing part of a plating step.

In FIG. 9A, the upper surface of the microstrip line, comprising the dielectric substrate 10, grounded conductor 12, and conducting strip 14, is covered with a mask member 38 having such a cross sectional shape as to allow the formation of the upper conductor 16. In this situation, gold, silver, or copper is deposited over the conducting strip 14 by plating. The plated layer builds up with time, the upper conductor 16 being grown to fill the hollow space defined by the cross-sectional contour of the mask 38.

When the plated layer surface has reached approximately the same level as the surface of the mask member 38, the plating is stopped, and the mask member 38 is dissolved or removed, to obtain the microstrip line shown in FIG. 9B. Since the microstrip line shown in FIG. 9B can be formed as an integral structure without requiring further processing, the above fabrication method is also suitable for a monolithic structure.

A microstrip line having the cross section shown in FIG. 2 or 3 can be fabricated using either method shown in FIGS. 8A, 8B or FIGS. 9A, 9B. In the case of the microstrip line having the cross section shown in FIG. 3, the cross-sectional thickness t will increase somewhat if the same cross-sectional area as that shown in FIG. 1 or 2 is to be obtained, but the rectangular cross section of the structure of FIG. 3 has the advantage that it is easy to fabricate.

Figure 10:
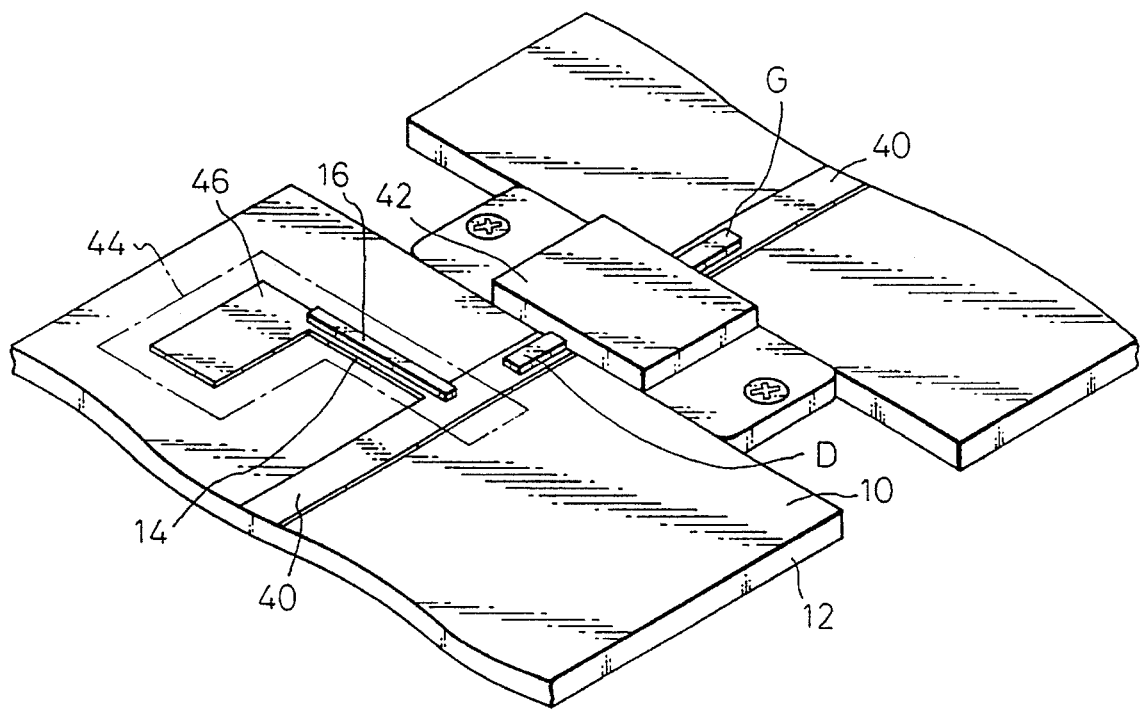
FIG. 10 is a perspective view showing an example in which the microstrip line of the invention is applied to a high power output amplifying circuit in microwave frequency applications.

FIG. 10 is a diagram showing an example in which the microstrip line of the invention is applied to a high power output amplifying circuit in microwave frequency applications. In FIG. 10, the reference numeral 10 is a dielectric substrate, 12 is a grounded conductor, 40 is a conducting strip for microwave signal transmission, 42 is an FET chip, 44 is a bias supply circuit for the drain D of the FET, 46 is a DC bias feed terminal, 14 is a conducting strip of high characteristic impedance for supplying a DC bias, 16 is an upper conductor formed on top of the conducting strip 14 and G denotes a gate terminal of FET 42.

With the bias supply circuit 44 using the microstrip line of FIG. 10, a DC bias current of about 8A can be supplied to the drain D of the FET 42, and furthermore, the characteristic impedance of the conducting strip 14 is nearly equal to the high characteristic impedance that the conducting strip 14 intrinsically has, so that there is little effect on the microwave circuit.

Figure 11:
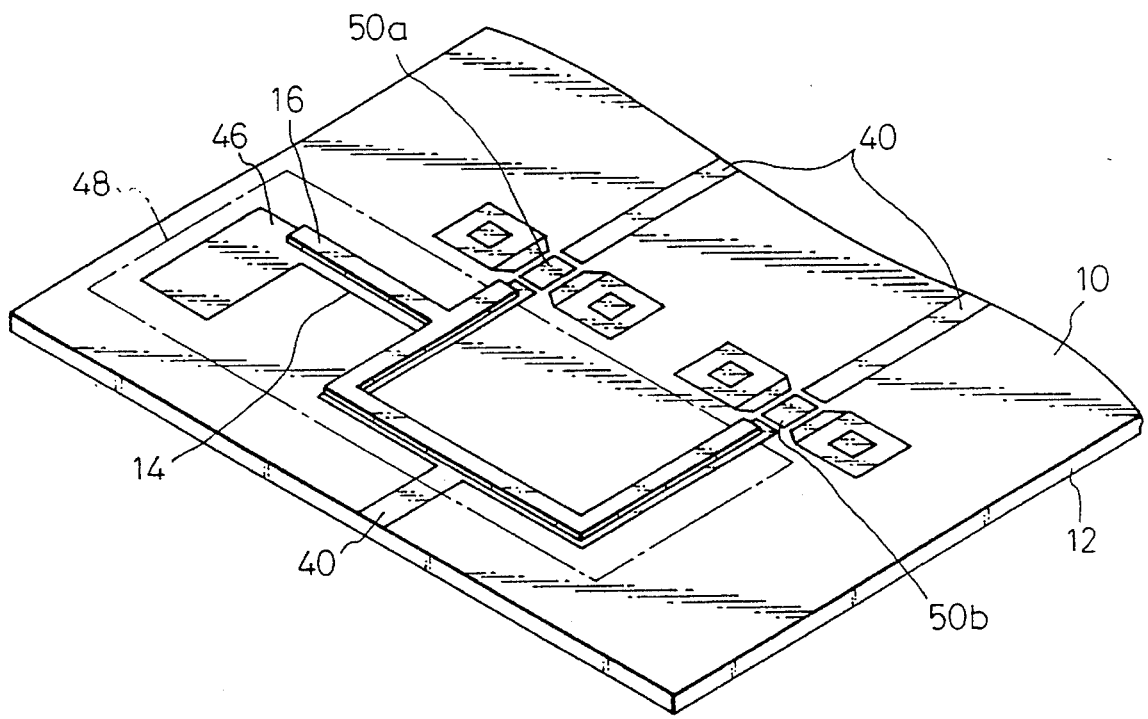
FIG. 11 is a perspective view showing an example in which the microstrip line of the invention is applied to a monolithic microwave integrated circuit.

FIG. 11 is a diagram showing an example in which the microstrip line of the invention is applied to a monolithic microwave integrated circuit. In FIG. 11, the reference numeral 10 is a dielectric substrate formed from a GaAs semiconductor, 40 is a conducting strip formed from gold for signal transmission, 48 is a circuit for bias supply and signal transmission, 50a and 50b are FET elements, and 16 is an upper conductor formed by depositing gold along portions of the conductor strips 14 and 40.

Since the upper conductor 16 of FIG. 11 does not affect the characteristic impedances of the conductor strips 14 and 40, the upper conductor 16 can be formed not only on the bias supply circuit but also on the microwave circuit. A DC bias current equivalent to two FETs flows through the portions of the upper conductor 16 that lie on the conductor strip 14, whereas a DC bias current equivalent of one FET flows through the portions of the upper conductor 16 that lie on the conductor strip 40.

As described, according to the invention, since the DC resistance of the transmission line can be reduced to allow a large current flow without affecting the normal characteristic impedance of the microstrip line, the invention contributes to the realization of a high-performance radio apparatus.

I claim:

1. A microstrip line which is able to supply a DC bias current for a semiconductor element comprising:

a dielectric substrate having a lower surface and an upper surface opposite to said lower surface;

a grounded conducted disposed on the lower surface of said dielectric substrate;

a conducting strip of width W disposed on the upper surface of said dielectric surface;

an upper conductor disposed on top of said conducting strip and having a rectangular cross sectional configuration of width W2 which is smaller than the width W of said conducting strip and with an area sufficient for supplying the DC bias current.

2. A microstrip line comprising:

a dielectric substrate having a lower surface and an upper surface opposite to said lower surface;

a grounded conductor disposed on the lower surface of said dielectric substrate;

a conducting strip of width W disposed on the upper surface of said dielectric surface;

an upper conductor disposed on top of said conducting strip and having a cross sectional configuration with a maximum width w2 which is smaller than the width W of said conducting strip;

wherein said upper conductor includes a lower portion having a width w1 that is smaller than the width w2, an upper portion having the width w2, and an intermediate portion located between said lower and said upper portions and having a width that gradually increases from w1 to w2.

3. A microstrip line comprising:

a dielectric substrate having a lower surface and an upper surface opposite to said lower surface;

a grounded conductor disposed on the lower surface of said dielectric substrate;

a conducting strip of width W disposed on the upper surface of said dielectric surface;

an upper conductor disposed on top of said conducting strip and having a cross sectional configuration with a maximum width w2 which is smaller than the width W of said conducting strip;

wherein said upper conductor has a wedgelike cross section with an upper end length of the maximum width w2 and a lower end length of a width of w1 that is smaller than the width of w2.

* * * * *